(12) United States Patent
Shen et al.

(10) Patent No.: US 9,071,261 B2
(45) Date of Patent: Jun. 30, 2015

(54) ACCURACY ENHANCEMENT TECHNIQUES FOR ADCS

(71) Applicants: Junhua Shen, Cambridge, MA (US); Ronald A. Kapusta, Bedford, MA (US)

(72) Inventors: Junhua Shen, Cambridge, MA (US); Ronald A. Kapusta, Bedford, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 14/043,284

(22) Filed: Oct. 1, 2013

(65) Prior Publication Data

US 2015/0091744 A1    Apr. 2, 2015

(51) Int. Cl.
*H03M 1/44* (2006.01)
*H03M 1/08* (2006.01)
*H03M 1/46* (2006.01)

(52) U.S. Cl.
CPC ............ *H03M 1/0854* (2013.01); *H03M 1/462* (2013.01)

(58) Field of Classification Search
CPC ... H03M 1/0634; H03M 1/0658; H03M 1/08; H03M 1/0854; H03M 1/20; H03M 1/202; H03M 1/206; H03M 1/207; H03M 1/38; H03M 1/40; H03M 1/42; H03M 1/44
See application file for complete search history.

(56) References Cited

U.S. PATENT DOCUMENTS

| | | | |
|---|---|---|---|
| 4,620,179 A * | 10/1986 | Cooper et al. | 341/156 |
| 6,894,627 B2 * | 5/2005 | Janakiraman et al. | 341/102 |
| 7,218,259 B2 | 5/2007 | Hurrell et al. | |
| 8,384,578 B2 * | 2/2013 | Verbruggen et al. | 341/156 |
| 8,749,412 B1 * | 6/2014 | Tsai | 341/118 |
| 2012/0194375 A1 | 8/2012 | Vigoda et al. | |
| 2014/0210653 A1 * | 7/2014 | Harpe | 341/110 |

FOREIGN PATENT DOCUMENTS

| | | |
|---|---|---|
| DE | 102 58 783 A1 | 7/2004 |
| EP | 2 546 992 A1 | 1/2013 |
| WO | 2010/140523 A1 | 12/2010 |

OTHER PUBLICATIONS

Giannini et al., An 820µW 9b 40MS/s Noise-Tolerant Dynamic-SAR ADC in 90nm Digital CMOS, 2008 IEEE International Solid-State Circuits Conference Digest of Technical Papers, IEEE, Feb. 2008, and supplement.*

Morie et al. A 71dB-SNDR 50MS/s 4.2mW CMOS SAR ADC by SNR Enhancement Techniques Utilizing Noise, with supplement, 2013 IEEE International Solid-State Circuits Conference, IEEE, Feb. 2013.*

Shrivastava, 12-bit non-calibrating noise-immune redundant SAR ADC for System-on-a-chip, 2006 IEEE International Symposium on Circuits and Systems, 2006. ISCAS 2006, IEEE, May 2006.*

(Continued)

*Primary Examiner* — Howard Williams
(74) *Attorney, Agent, or Firm* — Kenyon & Kenyon LLP

(57) ABSTRACT

Embodiments of the present invention may provide accuracy enhancement techniques to improve ADC SNRs. For example, regular bit trials from a most significant bit (MSB) to predetermined less significant bit of a digital word and extra bit trials may be performed. The results of the regular and extra bit trials may be combined to generate a digital output signal. A residue error may be measured, and the digital output signal may be adjusted based on the measured residue error.

24 Claims, 6 Drawing Sheets

(56) References Cited

OTHER PUBLICATIONS

P. Harpe et al., "A 2.2/2.7fJ/Conversion-step 10/12b 40kS/s SAR ADC with Data-Driven Noise Reduction," IEEE International Solid-State Circuits Conference, Digest of Technical Papers, Feb. 2013, pp. 270-271.

T. Morie et al., "A 71dB-SNDR 50MS/s 4.2mW CMOS SAR ADC by SNR Enhancement Techniques Utilizing Noise," IEEE International Solid-State Circuits Conference, Digest of Technical Papers, Feb. 2013, pp. 272-273.

Extended European Search Report and Search Opinion issued in counterpart European application No. 14186401.7, communication dated Mar. 4, 2015 (12 pages).

* cited by examiner

100

200

300

500

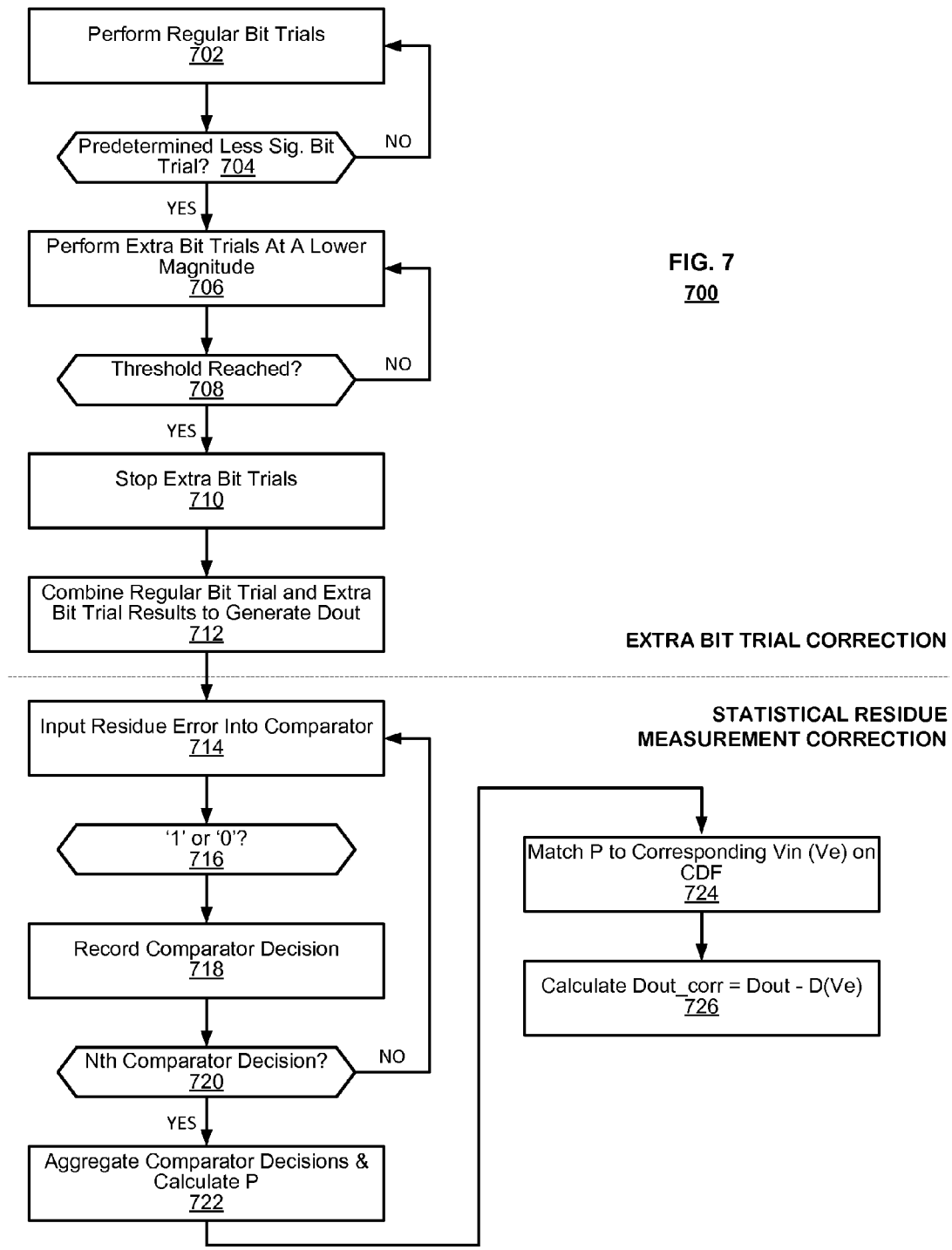

ACCURACY ENHANCEMENT TECHNIQUES FOR ADCS

BACKGROUND

The present invention relates to analog-to-digital converters (ADCs), in particular to accuracy enhancement thereof.

ADCs convert an input analog signal to a digital representation (e.g., digital word). A successive approximation register (SAR) ADC, a type of ADC, converts an input analog signal to a digital representation using a series of bit trials performed sequentially from a most-significant bit (MSB) to a least-significant bit (LSB). In each bit trial, a comparator compares the input analog signal to a reference voltage and based on the comparator decisions, the respective bit is resolved as either a '1' or '0'. Errors, however, can enter the conversion process, referred to as the conversion error of the SAR ADC. Typically, the larger the conversion error, the worse the signal-to-noise ratio (SNR) of the ADC.

Conversion errors can take various forms. For example, after the SAR ADC resolves the LSB, an error voltage may be present at the input of the comparator, often referred to as a residue input. This residue input may represent the conversion error of the SAR ADC and can include quantization errors, circuit noise, etc. Conventional approaches to reducing conversion errors include resolving smaller bits to reduce quantization errors or tuning components to reduce circuit noise; however, these approaches come at high costs in terms of speed, power consumption, and/or circuit area.

Therefore, the inventors recognized a need in the art for accuracy enhancement techniques to improve ADC SNRs without the aforementioned costs.

BRIEF DESCRIPTION OF THE DRAWINGS

FIG. 7 illustrates a process flow for an SAR ADC operation using extra bit trial correction and statistical residue measurement correction according to an embodiment of the present invention.

DETAILED DESCRIPTION

Embodiments of the present invention may provide a method that includes performing bit trials, using a SAR ADC including a comparator, to convert an analog input signal into a digital output signal; after completing the bit trials, measuring a residue voltage at an input of the comparator; and adjusting the digital output signal based on the measured residue error value.

Embodiments of the present invention may provide a method that includes performing regular bit trials using a SAR ADC to convert an analog input signal into a digital output signal from a MSB to a predetermined less significant bit of the ADC; after the predetermined less significant bit trial, performing extra bit trials at an equal and/or lower magnitude than the predetermined less significant bit trial; and combining the results of the regular bit trials and extra bit trials based on their corresponding bit weights to generate the digital output signal.

Embodiments of the present invention may provide a method that includes performing regular bit trials from a MSB to predetermined less significant bit of a digital word; performing extra bit trials; combining results of the regular and extra bit trials to generate a digital output signal; measuring a residue error; and adjusting the digital output signal based on the measured residue error.

Embodiments of the present invention may provide a circuit that includes a digital-to-analog (DAC) including a plurality of weighted components for performing bit trials; a comparator coupled to the DAC for performing the bit trials; and a SAR logic to control the bit trials, wherein the comparator is configured to perform a number of comparisons with residue error inputs after completion of the bit trials.

Figure 1A:
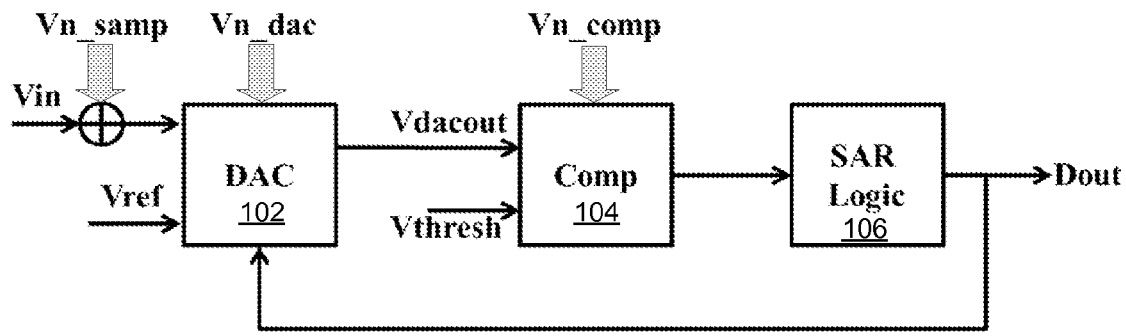
FIG. 1A illustrates a simplified block diagram of a SAR ADC according to an embodiment of the present invention.

FIG. 1A illustrates a SAR ADC 100 according to an embodiment of the present invention. The SAR ADC 100 may include a digital-to-analog converter (DAC) 102, a comparator 104, and SAR logic 106. FIG. 1A also illustrates possible noise sources in the SAR ADC 100 that may contribute to a conversion error associated with the SAR ADC 106, shown as Vn_samp, Vn_dac, and Vn_comp. FIG. 1A shows a single-ended implementation for illustration purposes only; however, embodiments of the present may include full differential implementation.

The DAC 102 may include a plurality of weighted components (e.g., capacitors) and corresponding switches that can be set by the SAR logic 106 for bit trials. In an embodiment, sizes of the components may be weighted in a binary fashion with the largest weighted component corresponding to the MSB and the smallest weighted component corresponding to the LSB. The DAC 102 may have a set of inputs and a feedback control input coupled to the SAR logic 106. One input may be coupled to an analog input signal Vin node and the other input may be coupled to a reference voltage Vref node. The DAC 102 may selectively sample Vin and Vref signals on its weighted components. The Vin node may be susceptible to an input sampling noise Vn_samp. Moreover, the DAC 102 may be susceptible to another noise source, DAC noise Vn_dac. The DAC 102 may generate an output Vdacout.

The DAC 102 may be coupled to the comparator 104 to receive the DAC output Vdacout. The comparator may compare Vdacout to a Vthresh voltage for the bit trials. In addition, the comparator 104 may be susceptible to a comparator noise Vn_comp.

The comparator 104 may be coupled to the SAR logic 106. The SAR logic 106 may receive the comparator decisions and save those decisions in registers in an embodiment. The SAR logic 106 may also control the DAC 102 switches for each bit trial. The SAR logic 106 may combine the results of the bit trials and generate the digital output signal Dout.

Figure 2:
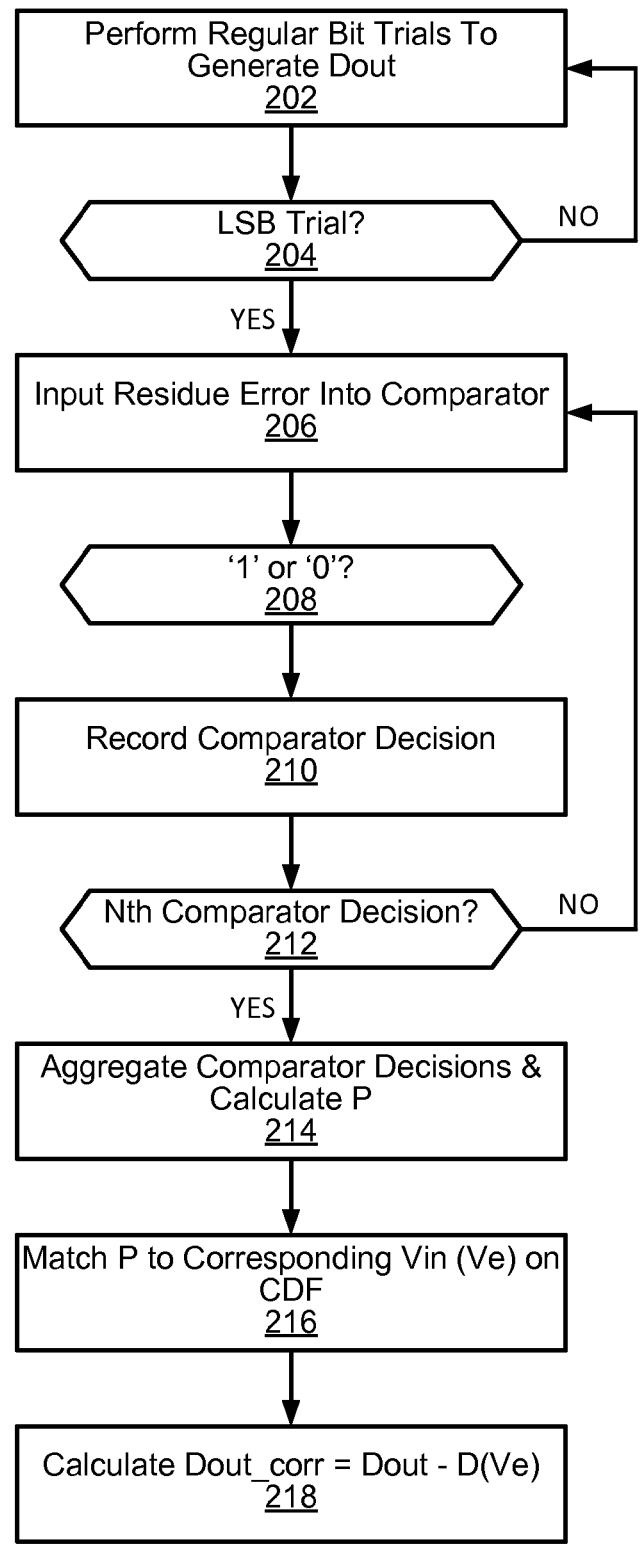
FIG. 2 illustrates a process flow for an SAR ADC operation using statistical residue measurement correction according to an embodiment of the present invention.

As FIG. 1A illustrates, the SAR ADC 100 may be susceptible to noise errors from a variety of sources. These noise errors may deteriorate the conversion process and may negatively affect the accuracy of the digital output signal Dout. FIG. 2 illustrates a flow process for a method 200 to improve accuracy in an ADC operation using statistical residue measurement correction according to an embodiment of the present invention. In an embodiment, method 200 may be performed using the SAR ADC 100 of FIG. 1A.

In step 202, regular bit trials may be performed to generate the digital output signal Dout. In an embodiment, the DAC 102 may first sample the analog input signal Vin, which is of an undetermined magnitude. The SAR ADC 100 may then convert the Vin to Dout representing the input magnitude according to bit trials, which is an iterative trial and error process. In a first bit trial, the input voltage may be compared to a first test voltage corresponding to 1000 . . . 0 (e.g., MSB=1 and all other bit positions=0). The comparator 104 may generate an output voltage indicating whether input voltage is greater than or less than the first test voltage. If the comparison yields a high output, the SAR logic 106 may record the MSB bit as '1', and conversely, if the comparison yields a low output, SAR logic 106 may record the MSB bit as '0'. The bit trials may be performed until the LSB is calculated and recorded. Accordingly, in step 204, the method 200 may check whether the current bit trial is the LSB trial. After the LSB bit trial, the regular bit trials may be completed.

Next, a residue error magnitude may be statistically measured and calculated after the regular bit trials. Residue error may refer to the residue (i.e., conversion error) present at the comparator 104 input after the LSB trial. After the regular bit trials, only the residue error may be present at the input of the comparator when comparator threshold Vthresh is set to zero. Thus, the comparator input (and DAC output Vdacout) may be expressed as:

$$V\text{dacout} = V\text{res}, \quad (1)$$

where Vres refers to the residue error. Furthermore, Vres may be expressed as:

$$V\text{res} = V_{n\_dac} + V_{e\_quant} + V_{e\_dec}, \quad (2)$$

where Vn_dac refers to DAC noise, Ve_quant refers to a quantization error, and Ve_dec refers to a decision error during regular bit trials.

Figure 1B:
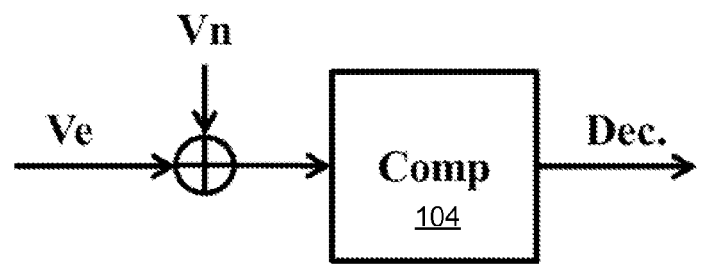
FIG. 1B illustrates a simplified block diagram of a comparator according to an embodiment of the present invention.

FIG. 1B illustrates the comparator 104 operation after the end of regular bit trials. Here, the comparator may have a combination of Ve, which refers to a deterministic part of the residue error Vres, and Vn, which refers to a total noise during a SAR ADC conversion, as an input. Ve may be expressed as:

$$Ve = V_{e\_quant} + V_{e\_dec}, \quad (3)$$

where Ve_quant refers to the quantization error and Ve_dec refers to the decision error as discussed above with equation (2). Further, Vn may be expressed as:

$$Vn = (V_{n\_dac}^2 + V_{n\_comp}^2)^{1/2}, \quad (4)$$

where Vn_dac refers to the DAC noise and Vn_comp refers to the comparator noise. The DAC noise Vn_dac and the comparator noise Vn_comp may be uncorrelated, and the thermal noise may follow a Gaussian distribution.

Returning to FIG. 2, the residue error may be input into the comparator in step 206. In step 208, the comparator may decide a '1' or '0' as the decision based on the residue input. In step 210, the comparator decision may be recorded. For example, the comparator decision may be recorded by the SAR logic 106. The method 200 may perform the comparator decisions with the residue input multiple (N) times. In step 212, the method 200 may check whether this comparator decision was the Nth decision. N may be pre-set. In an embodiment, N may be 10, 50, 100, or any suitable number. Hence, the comparator may perform N decisions based on the residue input.

In step 214, the comparator decisions may be aggregated to determine how many '1's and '0's resolved in the comparator decisions in steps 206-210. Based on the aggregation, the probability P of having a '1' decision or a '0' decision may be calculated. For example, if out of fifty comparator decisions with residue input, forty returned a '1' decision, then P may equal 0.8 (40/50).

Figure 3:
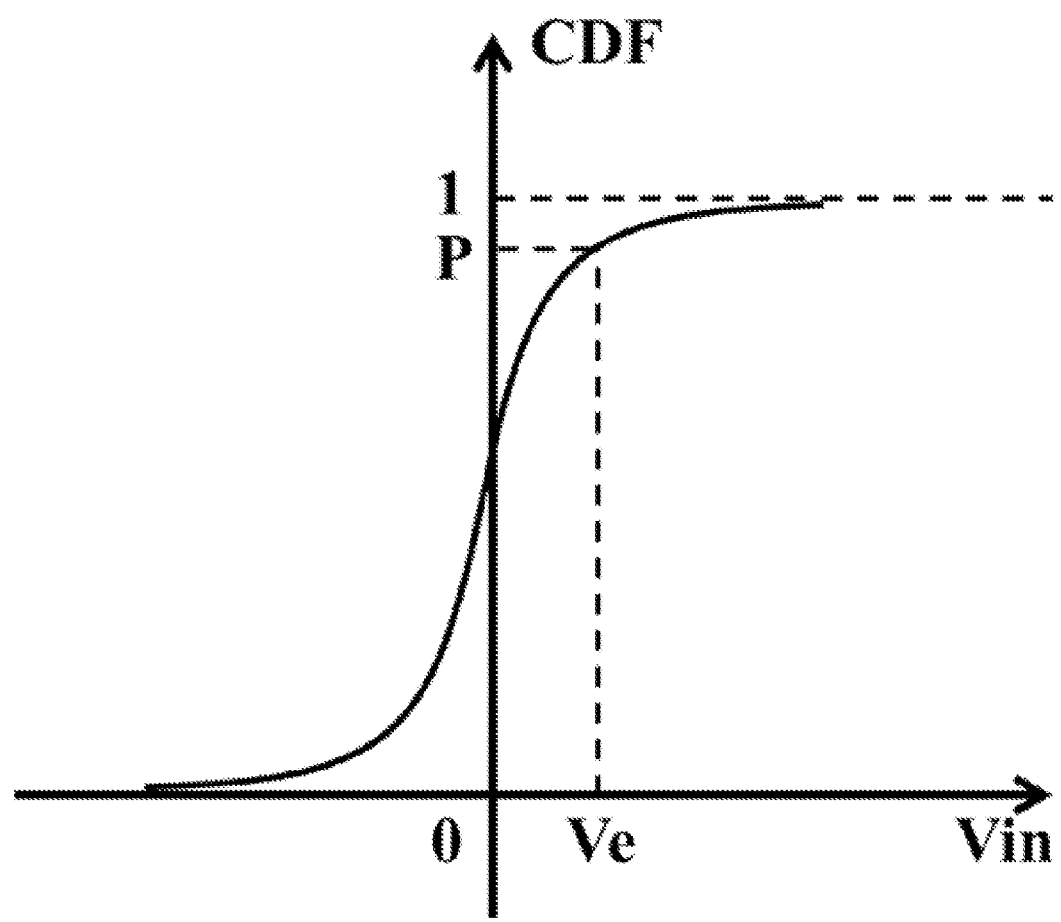
FIG. 3 illustrates an exemplary cumulative distribution function of Gaussian noise according to an embodiment of the present invention.

In step 216, the calculated probability P may be matched to a corresponding Ve according to a cumulative distribution function (CDF) of the Gaussian noise Vn. FIG. 3 illustrates an exemplary CDF of Vn versus the comparator input Vin. Thus, by matching the calculated probability P to the CDF, Ve may be statistically determined. In other words, Ve may be derived based on P and noise Vn:

$$D(Ve) = 2^{1/2} \text{erfinv}(2P-1) * D(Vn), \quad (5)$$

where erfinv represents an inverse error function, P refers the calculated probability of '1' decision, and Vn refers to the total noise during SAR ADC conversion. In an embodiment, Vn and the CDF of Vn may be measured during a calibration phase. In another embodiment, Vn and the CDF of Vn may be estimated on simulation results and may be pre-programmed.

In step 218, Dout may be compensated for the statistically calculated error as expressed as:

$$D\text{out\_corr} = D\text{out} - D(Ve), \quad (6)$$

where Dout_corr refers to a corrected digital output, Dout refers to the digital output generated during the regular bit trials, and D(Ve) refers to the statistically calculated error.

Thus, Dout_corr may be relatively free of errors except possibly sampling errors Vn_samp. For example, although ideally Dout would equal D(Vin), actual Dout in real conditions may be expressed as:

$$D\text{out} = D(V\text{in} + V_{n\_samp} + V_{e\_quant} + V_{e\_dec}), \quad (7)$$

where Vin refers to the analog input voltage, Vn_samp refers to the sampling noise, Ve_quant refers to the quantization error, and Ve_dec refers to the decision error. Further as explained above in equation (3), the quantization error (Ve_quant) and decision error (Ve_dec) form the deterministic part of the residue error, Ve. Hence, the corrected digital output may be expressed as:

$$D\text{out\_corr} = D(V\text{in} + V\text{nsamp}), \quad (8)$$

Therefore, method 200 statistically measures Ve and the error is largely compensated for in the digital domain to significantly improve SNR of the ADC.

Figure 4A:
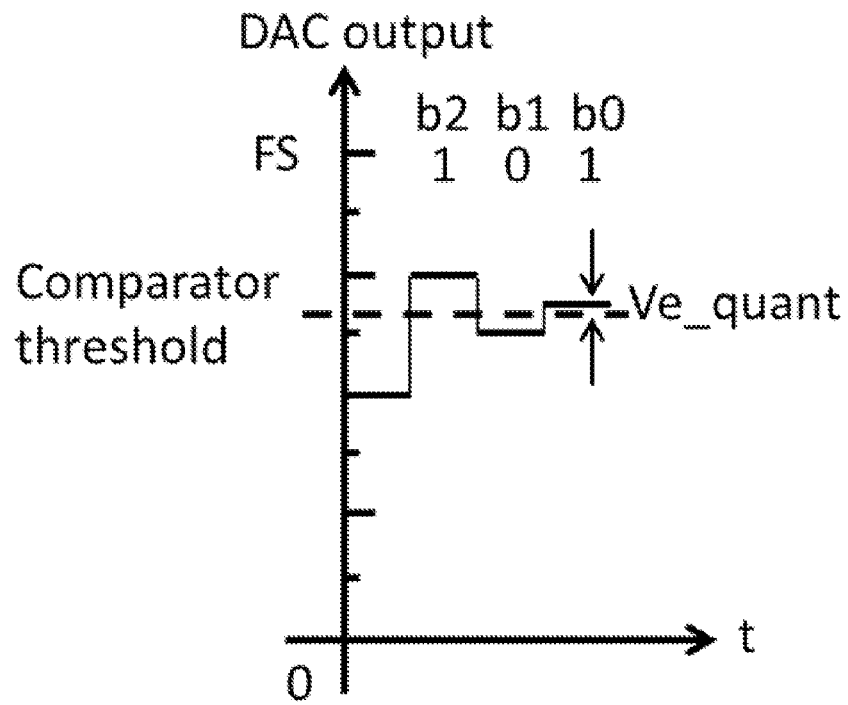
FIG. 4A illustrates an exemplary ideal 3 bit conversion.
Figure 4B:
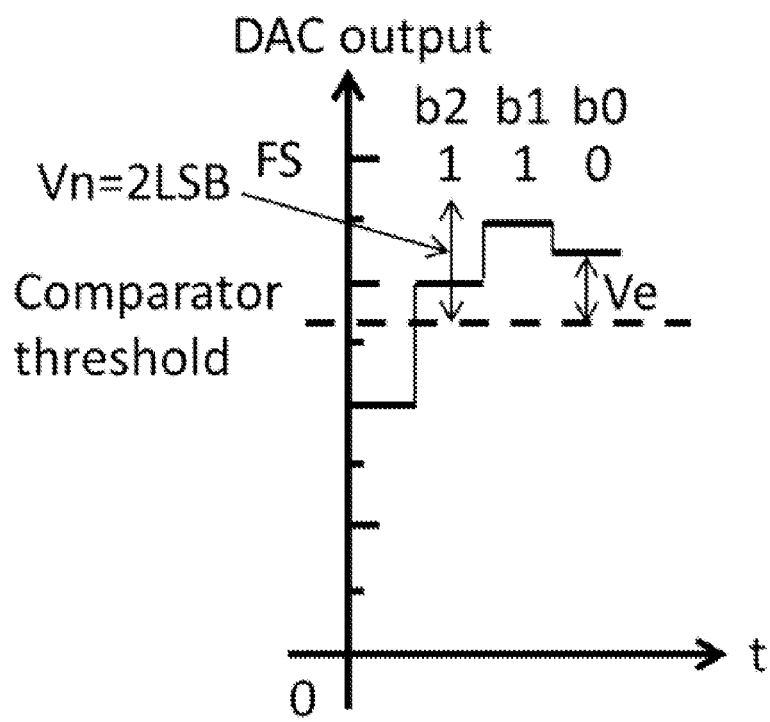
FIG. 4B illustrates an exemplary non-ideal 3 bit conversion.

For statistical residue measurement correction, residue error comparable to the noise Vn may be preferable. In an ideal SAR ADC, the residue error at the comparator input after all regular bit trials is determined by the LSB decision. This error is referred to as the quantization error. However, as described above residue error may also include a decision error factor. For example, consider the two scenarios depicted in FIG. 4A and FIG. 4B. FIG. 4A illustrates a bit trial process for a 3 bit SAR ADC example with no decision errors. Hence, only a quantization error Ve_quant remains after the LSB (b0) trial. On the other hand, FIG. 4B illustrates a bit trial process for a 3 bit SAR ADC example with a wrong decision in the second bit trial (b1) caused by, for example, an instantaneous noise depicted as 2LSB during the comparator decision. Thus, after the LSB (b0), the residue error Ve here may include a quantization error Ve_quant and a decision error Ve_dec component, which leads to a much larger residue error as compared to FIG. 4A.

Figure 5:
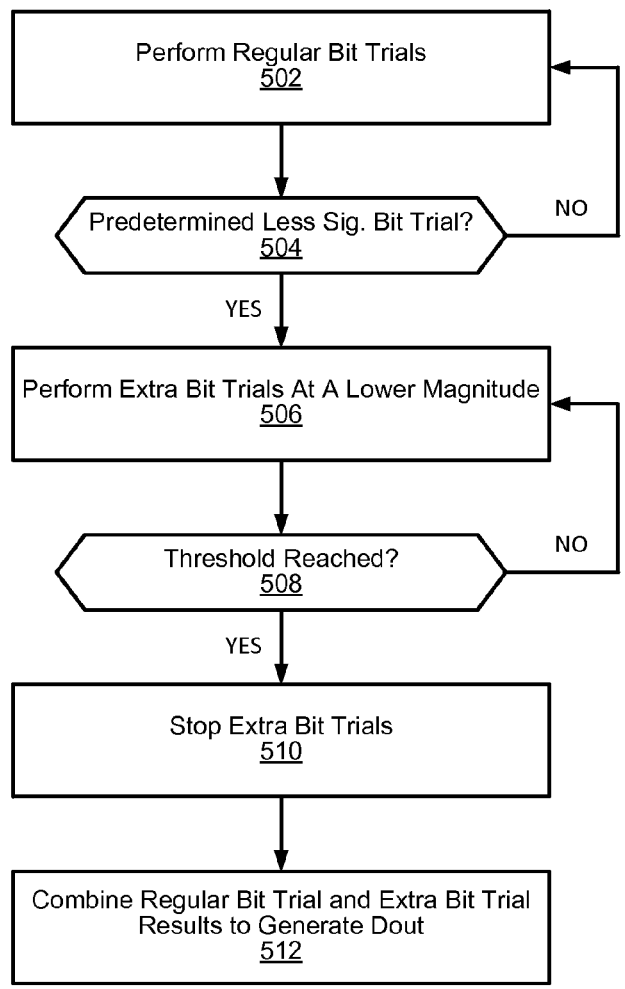
FIG. 5 illustrates a process flow for a SAR ADC operation using extra bit trial correction according to an embodiment of the present invention.

In an embodiment of the present invention, extra bit trials of lesser magnitude than the LSB trial (e.g., half of b0) may be introduced and performed to reduce the residue error Ve. FIG. 5 illustrates a flow process for a method 500 to correct noise errors in an ADC operation using extra bit trial correction according to an embodiment of the present invention. In an embodiment, method 500 may be performed using the SAR ADC 100 of FIG. 1A.

In step 502, regular bit trials may be performed to generate the digital output signal Dout. In an embodiment, the DAC 102 may first sample the analog input signal Vin, which is of an undetermined magnitude. The SAR ADC 100 may then convert the Vin to Dout representing the input magnitude according to bit trials, which is an iterative trial and error process. In a first bit trial, the input voltage may be compared to a first test voltage corresponding to 1000 . . . 0 (e.g., MSB=1 and all other bit positions=0). The comparator 104 may generate an output voltage indicating whether input voltage is greater than or less than the first test voltage. If the comparison yields a high output, the SAR logic 106 may record the MSB bit as '1', and conversely, if the comparison yields a low output, SAR logic 106 may record the MSB bit as '0'. The bit trials may be performed until a predetermined less significant bit is calculated and recorded. Accordingly, in step 504, the method 500 may check whether the current bit trial is the predetermined less significant bit trial. After this bit trial, the regular bit trials may be completed. In an embodiment, the predetermined less significant bit trial may correspond to an LSB trial.

Figure 6:
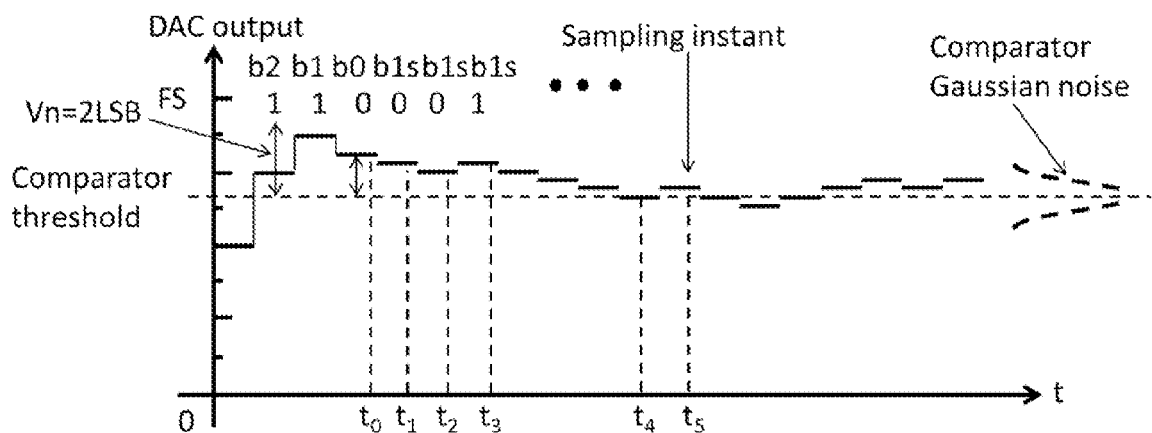
FIG. 6 illustrates an exemplary analog-to-digital conversion according to an embodiment of the present invention.

FIG. 6 illustrates a bit trial process for a 3 bit SAR ADC example performing the method 500 of FIG. 5. Bits b2, b1, and b0 may correspond to the regular bit trials in steps 502 and 504. In the FIG. 6 example, a wrong decision was made for bit b1; however, regular bit trials without wrong decisions may also be used with the method of FIG. 5. After the LSB b0, a significant residue error Ve is shown in FIG. 6 at time t0, which corresponds to the end of the regular bit trials. Also, in the FIG. 6 example, the DAC output at the end of the regular bit trials is positive compared to the comparator threshold.

After completion of the regular bit trials, the method 500 may introduce extra bit trials to reduce the residue error in step 506. In an embodiment, these extra bit trials may be of lesser magnitude than of the LSB bit trial. For example, the extra bit trials may be half the magnitude of the LSB bit trial of b0. In an embodiment, the extra bit trials may be sub-noise level repeat trials. In another embodiment, these extra bit trials may be more significant than the LSB. In FIG. 6, the first extra bit trial 131s is at time t1. Since the DAC output at the end of the regular bit trials is positive in the FIG. 6 example and the comparator noise is on average 0, it may be more likely that the first 131s would decide a '0' at t1 due to the negative feedback nature of the SAR ADC loop. Hence, the DAC output may be approaching the comparator threshold. Similarly, the second extra bit trial 131s may be more likely to decide a '0'. It is also possible though that the comparator may decide a '1' even though the DAC output might be positive as illustrated for the third extra bit trial 131s at time t3.

Extra bit trials may be performed until a threshold is reached in step 508 of FIG. 5. After the threshold is reached, the extra bit trials may be stopped in step 510. In an embodiment, the threshold may correspond to a set number of extra bit trials. In another embodiment, the threshold may correspond to when the polarity of the DAC output changes as compared to the comparator threshold or sometime after this polarity change. For example, as illustrated in FIG. 6, the DAC output may change polarity as compared to the comparator threshold at time t4. In an embodiment, the polarity change time may not be known beforehand and may depend on the repeat trial magnitudes, ADC noise level, and/or redundancy for earlier trials of the ADC. The last few trial decisions may be tracked to determine whether the comparator input or DAC output is approaching the comparator threshold. In an embodiment, the number of repeat trials may be programmable. After this polarity change, the residue error Ve, which refers to the difference between the DAC output and the comparator threshold, may be governed by a Markov chain random process. Hence, the residue error Ve may not get better (i.e., decrease) after polarity change in time t4. Accordingly, in an embodiment, the method 500 may stop the extra bit trials at or closely after the polarity change of the DAC output as compared to the comparator threshold in step 510.

At the conclusion of the extra bit trials, the results (decisions) of the regular bit trials of step 502 and extra bit trials of step 506 may be combined to generate Dout. In an embodiment, the magnitude of the repeating LSBs may scale down gradually to minimize the residue error. For example, for an 8-bit SAR ADC, the regular and extra bit trials may be expressed as:

b7, b6, b5, b4, b3, b3, b3, b3, b2, b2, b2, b2, b1, b1, b1, b1, b0, b0, b0, b0, b1s, b1s, b1s, b1s, b1s, b1s, b1s, b1s;

In an embodiment, the repeat trials may start before the LSB, this may be beneficial when the ADC noise level is around or larger than 1 LSB.

Therefore, by adding extra lower magnitude bit trials, the residue error may be reduced significantly in an ADC.

Moreover, the two aforementioned ADC accuracy enhancement techniques—extra bit trial correction and statistical residue measurement correction—may be used in conjunction according to an embodiment of the present invention. For example, the extra bit trial correction technique may initially be performed to reduce the residue error, and then the statistical residue measurement correction technique may be performed to further reduce (or eliminate) the residue error Ve. By combining these two techniques, the comparator and DAC may have a higher noise tolerance while still achieving a high SNR and thus enhancing the accuracy of the ADC. FIG. 7 illustrates a flow process for a method 700 to correct errors in an ADC operation using extra bit trial correction and statistical residue measurement correction according to an embodiment of the present invention. In an embodiment, method 700 may be performed using the SAR ADC 100 of FIG. 1A.

In step 702, regular bit trials may be performed to generate the digital output signal Dout. In an embodiment, the DAC 102 may first sample the analog input signal Vin, which is of an undetermined magnitude. The SAR ADC 100 may then convert the Vin to Dout representing the input magnitude according to bit trials, which is an iterative trial and error process. In a first bit trial, the input voltage may be compared to a first test voltage corresponding to 1000 . . . 0 (e.g., MSB=1 and all other bit positions=0). The comparator 104 may generate an output voltage indicating whether input voltage is greater than or less than the first test voltage. If the comparison yields a high output, the SAR logic 106 may record the MSB bit as '1', and conversely, if the comparison yields a low output, SAR logic 106 may record the MSB bit as '0'. The bit trials may be performed until a predetermined less significant bit is calculated and recorded. Accordingly, in step 704, the method 700 may check whether the current bit trial is the predetermined less significant bit trial. After this bit trial, the regular bit trials may be completed. In an embodiment, the predetermined less significant bit trial may correspond to an LSB trial.

Next, the method 700 may introduce extra bit trials to reduce the residue error in step 706. In an embodiment, these extra bit trials may be of lesser magnitude than of the LSB bit trial. For example, the extra bit trials may be half the magnitude of the LSB bit trial. In an embodiment, the extra bit trials may be sub-noise level repeat trials. In another embodiment, these extra bit trials may be more significant than the LSB. Extra bit trials may be performed until a threshold is reached in step 708. After the threshold is reached, the extra bit trials may be stopped in step 710. In an embodiment, the threshold may correspond to a set number of extra bit trials. In another embodiment, the threshold may correspond to when the polarity of the DAC output changes as compared to the comparator threshold or sometime after the polarity changes. At the conclusion of the extra bit trials, the results (decisions) of the regular bit trials of step 702 and extra bit trials of step 706 may be combined to generate Dout.

Next, the method 700 may statistically measure the remaining residue to error for correction. The residue error may be input into the comparator in step 714. In step 716, the comparator may decide a '1' or '0' as the decision based on the residue input. In step 718, the comparator decision may be recorded. For example, the comparator decision may be recorded by the SAR logic 106. The comparator decisions with the residue input in steps 714-718 may be performed multiple (N) times. In step 720, the method 700 may check whether this comparator decision was the Nth decision. N may be pre-set. In an embodiment, N may be 10, 50, 100, or any suitable number. Hence, the comparator may perform N decisions based on the residue input. In step 722, the comparator decisions may be aggregated to determine how many '1's and '0's are resolved in the comparator decisions in steps 206-210. Based on the aggregation, the probability P of having a '1' decision or a '0' decision may be calculated. For example, if out of fifty comparator decisions, forty returned a '1' decision, then P may equal 0.8 (40/50). In step 724, the calculated probability P may be matched to a corresponding Ve according to cumulative distribution function (CDF) of the Gaussian noise Vn as described above. In step 726, Dout may be compensated based on the statistically calculated error as expressed as:

$$Dout\_corr = Dout - D(Ve), \quad (6)$$

where Dout_corr refers to a corrected digital output, Dout refers to the digital output generated during the regular bit trials and extra bit trials, and D(Ve) refers to the statistically calculated error. Thus, the method 700 may first reduce the residue error by performing extra bit trials and then further reduces the residue error by employing statistical residue error measurement correction. Therefore, the method 700 may significantly enhance the accuracy of ADC operations, in particular SAR ADC operations.

Several embodiments of the invention are specifically illustrated and/or described herein. However, it will be appreciated that modifications and variations of the invention are covered by the above teachings and within the purview of the appended claims without departing from the spirit and intended scope of the invention.

We claim:

1. A method, comprising:
   performing bit trials, using a SAR ADC including a comparator, to convert an analog input signal into a digital output signal;
   after completing the bit trials, performing a plurality of comparator decisions by the comparator with a residue error as an input to the comparator;
   based on the comparator decisions, measuring a residue voltage at the input of the comparator; and
   adjusting the digital output signal based on the measured residue error value.

2. The method of claim 1, wherein measuring the residue voltage includes statistically calculating a residue error value.

3. The method of claim 2, wherein statistically calculating the residue error value includes calculating the probability of the comparator decisions to the residue error inputs.

4. The method of claim 3, wherein statistically calculating the residue error value further includes matching the probability of the comparator decisions to a corresponding residue error value according to a cumulative distribution function of noise in the SAR ADC.

5. The method of claim 4, wherein the cumulative distribution function of noise in the SAR ADC is measured during calibration of the SAR ADC.

6. The method of claim 4, wherein the cumulative distribution function of noise in the SAR ADC is preprogrammed.

7. A method, comprising:
   performing regular bit trials using a SAR ADC to convert an analog input signal into a digital output signal for each bit position from a most significant bit (MSB) to a least significant bit (LSB) of the ADC;
   in addition to the regular bit trials, performing repeat bit trials of select regular bit trial(s) at an equal and/or lower magnitude than a predetermined less significant bit trial, wherein each repeat bit trial is weighted the same as its corresponding regular bit trial; and
   summing the results of the regular bit trials and the repeat bit trials based on their corresponding bit weights to generate the digital output signal.

8. The method of claim 7, wherein the predetermined less significant bit is LSB.

9. The method of claim 7, further comprising performing a predetermined number of repeat bit trials.

10. The method of claim 7, performing the repeat bit trials until a threshold is reached.

11. The method of claim 10, wherein the threshold includes a DAC output crossing a comparator threshold in the SAR ADC.

12. The method of claim 7, wherein the repeat bit trials are sub-noise level repeat trials.

13. The method of claim 7, wherein the magnitude of the repeat bit trials scales down.

14. The method of claim 7, wherein the magnitude of the repeat bit trials is the same as the predetermined less significant bit.

15. A method, comprising:
   performing regular bit trials using a comparator from a most significant bit (MSB) to a least significant bit (LSB) of a digital word;
   performing repeat bit trials of select regular bit trials at an equal and/or lower magnitude than a predetermined less significant bit trial, wherein each repeat bit trial is weighted the same as its corresponding regular bit trial;
   summing results of the regular and repeat bit trials based on their corresponding bit weights to generate a digital output signal;
   measuring a residue error by performing a plurality of comparator decisions by the comparator used to perform the regular bit trials with the residue error as an input; and
   adjusting the digital output signal based on the measured residue error.

16. The method of claim 15, wherein the method is performed using a SAR ADC.

17. The method of claim 15, wherein the repeat bit trials are sub-noise level repeat trials.

18. The method of claim 15, wherein the magnitude of the repeat bit trials scales down.

19. The method of claim 15, wherein the magnitude of the repeat bit trials is the same as the predetermined less significant bit.

20. The method of claim 15, wherein measuring the residue error value includes calculating a probability of comparator decisions to residue error inputs.

21. The method of claim 20, wherein measuring the residue error value further includes matching the probability of the comparator decisions to a corresponding residue error value according to a cumulative distribution function of noise in the SAR ADC.

22. A circuit, comprising:
a digital-to-analog (DAC) including a plurality of weighted components for performing bit trials;
a comparator coupled to the DAC for performing the bit trials; and a
successive approximation register (SAR) logic to control the bit trials,
wherein the comparator is configured to perform a number of comparisons with residue error inputs after completion of the bit trials and wherein the circuit is configured to measure residue error based on the comparisons.

23. The circuit of claim 22, wherein the bit trials include regular bit trials from a most significant bit (MSB) to a least significant bit (LSB) of a digital word and repeat bit trials of select bit trials for a predetermined less significant bit(s) of the digital word, the repeat bit trials to be performed at an equal or lower magnitude than the predetermined less significant bit.

24. The circuit of claim 23, wherein the results of the regular bit trials and repeat bit trials are summed based on their corresponding bit weights.

* * * * *